US008084083B2

(12) United States Patent
Otani et al.

(10) Patent No.: US 8,084,083 B2
(45) Date of Patent: Dec. 27, 2011

(54) METHOD FOR MANUFACTURING AN ANISOTROPIC CONDUCTIVE ADHESIVE SHEET

(75) Inventors: Akira Otani, Fuji (JP); Koya Matsuura, Fuji (JP)

(73) Assignee: Asahi Kasei EMD Corporation, Tokyo (JP)

( * ) Notice: Subject to any disclaimer, the term of this patent is extended or adjusted under 35 U.S.C. 154(b) by 0 days.

(21) Appl. No.: 13/008,537

(22) Filed: Jan. 18, 2011

(65) Prior Publication Data

US 2011/0114256 A1 May 19, 2011

Related U.S. Application Data

(62) Division of application No. 10/595,914, filed as application No. PCT/JP2004/017944 on Dec. 2, 2004, now abandoned.

(30) Foreign Application Priority Data

Dec. 4, 2003 (JP) .................................. 2003-406108

(51) Int. Cl.
*B05D 1/12* (2006.01)
(52) U.S. Cl. ........................................ 427/174; 427/205
(58) Field of Classification Search .................. 427/174, 427/205
See application file for complete search history.

(56) References Cited

U.S. PATENT DOCUMENTS

| 5,240,761 | A | * | 8/1993 | Calhoun et al. ............... 428/148 |
| 5,362,421 | A | | 11/1994 | Kropp et al. |
| 6,020,059 | A | | 2/2000 | Yamada et al. |
| 7,416,822 | B2 | | 8/2008 | Kanada et al. |
| 7,625,969 | B2 | | 12/2009 | Sonobe et al. |
| 7,671,142 | B2 | | 3/2010 | Maekawa |
| 2001/0008169 | A1 | | 7/2001 | Connell et al. |
| 2007/0029256 | A1 | | 2/2007 | Nakano et al. |
| 2007/0093583 | A1 | | 4/2007 | Kakegawa |
| 2007/0129484 | A1 | | 6/2007 | Horio et al. |
| 2007/0175579 | A1 | | 8/2007 | Otani et al. |

FOREIGN PATENT DOCUMENTS

| CN | 1128040 | 7/1996 |
| CN | 1307625 | 8/2001 |
| JP | 2-117980 | 5/1990 |
| JP | 6-045024 | 2/1994 |
| JP | 6-060712 | 3/1994 |
| JP | 6-349339 | 12/1994 |
| JP | 2895872 | 3/1999 |
| JP | 11-121072 | 4/1999 |
| JP | 2000-149677 | 5/2000 |
| JP | 2000-178511 A | 6/2000 |
| JP | 3165477 | 3/2001 |
| JP | 2002-519473 | 7/2002 |
| JP | 2002-358825 | 12/2002 |
| JP | 2003-064324 | 3/2003 |

OTHER PUBLICATIONS

International Search Report for PCT/JP2004/017944, mailed Feb. 15, 2005.
Chinese Office Action issued with respect to patent family member Chinese Application No. 200910117908.X, issued Dec. 16, 2010, along with an English-language translation.
Japanese Office Action issued with respect to Japanese Patent Application No. 2005-515962, issued Mar. 23, 2011.

* cited by examiner

*Primary Examiner* — Frederick Parker
(74) *Attorney, Agent, or Firm* — Greenblum & Bernstein, PLC

(57) ABSTRACT

A method for manufacturing an anisotropic conductive adhesive sheet is disclosed. The sheet comprises at least a curing agent, a curable insulating resin, and conductive particles. The method comprises providing an adhesive layer on a biaxially stretchable film to form a laminate, densely packing conductive particles having an average particle size of 1 to 8 μm on the laminate to form a conductive particle-attached film, biaxially stretching and holding the conductive particle-attached film so that the average particle distance between adjacent conductive particles is at least one to five times or less the average particle size of the conductive particles and not greater than 20 μm. The conductive particles are transferred to an adhesive sheet containing at least a curing agent and a curable insulating resin and having a thickness of at least 1.5 times the average particle distance between the conductive particles but not greater than 40 μm.

1 Claim, No Drawings

METHOD FOR MANUFACTURING AN ANISOTROPIC CONDUCTIVE ADHESIVE SHEET

RELATED APPLICATIONS

This application is a divisional of U.S. application Ser. No. 10/595,914 filed May 19,2006, now abandoned, which is a national stage international application of PCT/JP2004/017944, filed Dec. 2, 2004, which claims priority to Japanese application No. 2003-406108, filed Dec. 4, 2003. The disclosure of application No. 10/595,914 and PCT/JP2004/017944 are incorporated by reference herein in their entireties.

TECHNICAL FIELD

The present invention relates to an anisotropic conductive adhesive sheet that has excellent microcircuit connecting properties, and a connecting structure.

BACKGROUND ART

Heretofore, concerning an anisotropic conductive adhesive sheet for connecting microcircuits, various conductive particles and anisotropic conductive adhesive compositions have been examined in order to improve connecting properties and prevent short-circuiting. For example, heretofore known methods include a method wherein insulating particles having a coefficient of thermal expansion equivalent are compounded to conductive particles (see Patent Document 1); a method wherein insulating particles are deposited on the surfaces of conductive particles in order to prevent short-circuiting (see Patent Document 2); a method wherein the surfaces of conductive particles are coated with an electrically insulating resin (see Patent Document 3); a method wherein layers containing and not containing conductive particles are stacked to prevent short-circuiting between adjacent circuits (see Patent Document 4); a method wherein a terminal circuit is coated with a photosensitive resin, parts other than a connecting part are selectively cured to make such parts not adhesive, and conductive particles are deposited on the part having adhesion and then coated with an adhesive resin to prevent short-circuiting between adjacent circuits (see Patent Document 5); a method wherein a peeling liner having a depression is previously formed, a single or plurality of conductive particle is disposed in the depression, and it is deposited on an adhesive layer to fabricate an anisotropic conductive adhesive sheet (see Patent Document 6); and a method wherein a biaxially stretchable sheet is coated with conductive particles, the coated sheet is stretched within a range not exceeding the particle diameter of the conductive particles, and the isolated conductive particles are transferred into the adhesive layer to fabricate an anisotropic conductive adhesive sheet (see Patent Document 7).

However, in the conventional art wherein insulating properties are imparted to conductive particles or the like, there was limitation to micronize the particle diameter of conductive particles for insulating coating or insulating coating deposition, and both the security of insulating properties and the security of number of connecting particles could not be satisfied in the case of microcircuit connecting. Also in the conventional art for preventing short-circuiting by adhesive compositions, the security of insulation properties and electrical connecting properties were not simultaneously satisfied in the case of microcircuit connecting. Furthermore, in Patent Document 6, although an example wherein a peeling liner having a depression is previously formed and a single or plurality of conductive particle is disposed in the depression is disclosed, no examples wherein this is deposited on the adhesive layer to form an anisotropic conductive adhesive sheet are disclosed. It was actually difficult to dispose a single conductive particle in each depression shallower than the particle diameter of the conductive particle. To the contrary, although a single conductive particle could be disposed in each depression deeper than the particle diameter of the conductive particle, it was difficult to deposit on the adhesive layer. As a result, the obtained anisotropic conductive adhesive could not satisfy both the security of insulating properties and the security of number of connecting particles. Also since the anisotropic conductive adhesive sheet disclosed in Patent Document 7 is based on a technical idea to secure electrical conductivity by sandwiching conductive particles between terminals themselves and at the same time to secure insulating properties by fixing conductive particles, the particle diameter of conductive particles distance between adjacent conductive particles and the film thickness of the anisotropic conductive adhesive sheet must be of substantially the same values. Therefore, the gaps in the lateral direction of a terminal to be coupled were not filled with the insulating resin, and insulation properties were not be satisfied. Connecting properties of terminals themselves were also not satisfactory due to a small amount of resin. In view of the security of electrical conductivity, the distance between adjacent conductive particles cannot exceed the particle diameter of the conductive particles, and particularly in the case of microcircuit connecting, it is difficult to satisfy both the security of insulating properties and the security of electrical connecting properties at the same time.

Patent Document 1: JP-A-6-349339
Patent Document 2: JP Patent No. 2895872
Patent Document 3: JP Patent No. 2062735
Patent Document 4: JP-A-6-45024
Patent Document 5: JP Patent No. 3165477
Patent Document 6: JP-A-2002-519473
Patent Document 7: JP-A-2-117980

DISCLOSURE OF THE INVENTION

Problems to be Solved by the Invention

It is an object of the present invention to provide an anisotropic conductive adhesive sheet that realizes favorable electrical connecting properties without impairing insulation properties between adjacent circuits of a microcircuit, a method for the manufacture thereof and a connecting structure using the same.

Means for Solving the Problems

As a result of extensive studies to solve the above-described problems, the present inventors have found that the problems can be solved by the use of an anisotropic conductive adhesive sheet characterized in that conductive particles having a certain average particle size are present in a certain range without contact with at least a certain proportion of conductive particles. Specifically, the present invention provides the followings.

(1) An anisotropic conductive adhesive sheet comprising at least a curing agent, a curable insulating resin and conductive particles, wherein 90% or more of the conductive particles are present in a region of a thickness of not greater than 2.0 times the average particle size of the conductive particles extending from one surface of the anisotropic conductive adhesive sheet in the thickness direction, and 90% or more of the conductive particles are present without contact with other conductive particles, wherein the average particle size of the conductive particles is 1 to 8 µm, and the average particle distance between adjacent conductive particles is at least once but five times or less the average particle size and not greater than 20 µm, and wherein the thickness of the anisotropic conductive adhesive sheet is at least 1.5 times the average particle distance but not greater than 40 µm.

(2) The anisotropic conductive adhesive sheet according to (1), wherein the conductive particles are at least those selected from the group consisting of noble metal-coated resin particles, noble metal-coated metal particles, metal particles, noble metal-coated alloy particles, and alloy particles.

(3) A method for manufacturing an anisotropic conductive adhesive sheet comprising providing an adhesive layer on a biaxially stretchable film to form a laminate, densely packing conductive particles having an average particle size of 1 to 8 µm on the laminate to form a conductive particle-attached film, biaxially stretching and holding the conductive particle-attached film so that the average particle distance between adjacent conductive particles is at least once (1) but five (5) times or less the average particle size of the conductive particles and not greater than 20 µm, and transferring the conductive particles to an adhesive sheet containing at least a curing agent and a curable insulating resin and having a thickness of at least 1.5 times the average particle distance between the conductive particles but not greater than 40 µm.

(4) The method according to (3), wherein the biaxially stretchable film is a long film and the adhesive sheet is a long adhesive sheet.

(5) A method for electrically connecting an electronic circuit component having fine connecting terminals to a circuit board having a circuit corresponding thereto using an anisotropic conductive adhesive sheet, comprising electrically connecting the electronic circuit component to the circuit board having a circuit corresponding thereto using the anisotropic conductive adhesive sheet according to (1) or (2), wherein said electronic circuit component has a height of the fine connecting terminals of 3 to 15 times the average particle distance between conductive particles and not greater than 40 µm, a distance between the fine connecting terminals of 1 to 10 times the average particle distance and not greater than 40 µm, and a pitch of the fine connecting terminals of 3 to 30 times the average particle distance and not greater than 80 µm.

(6) A fine connecting structure obtained by the method according to (5).

Advantages of the Invention

The anisotropic conductive adhesive and connecting structure of the present invention have favorable insulating characteristics between adjacent circuits, and have favorable electrical connecting properties between coupled circuits. The present invention also exerts the above-described effect particularly in the connecting of microcircuits.

BEST MODE FOR CARRYING OUT THE INVENTION

The present invention will be specifically described below.

First, conductive particles in the present invention will be described. In the present invention, although heretofore known conductive particles can be used, it is preferable to use at least those selected from the group consisting of noble metal-coated resin particles, noble metal-coated metal particles, metal particles, noble metal-coated alloy particles, and alloy particles. More preferably, these particles have melting points not higher than 500° C. As the noble metal-coated resin particles, the use of spherical particles of polystyrene, benzoguanamine, polymethyl methacrylate or the like coated with nickel and gold in this order is preferable. As the noble metal-coated metal particles, the use of particles of a metal, such as nickel and copper, coated with a noble metal, such as gold, palladium and rhodium, on the outermost layer is preferable; and as the noble metal-coated alloy particles, the use of alloy particles described below coated with a noble metal, such as gold, palladium and rhodium, on the outermost layer is preferable. As coating methods, thin-film forming methods such as vapor deposition and sputtering, coating methods by dry blending, or wet processes such as electroless plating and electrolytic plating, can be used. In view of mass productivity, an electroless plating method is preferable. As metal particles and alloy particles, the use of one or two or more selected from the group consisting of metals, such as silver, copper and nickel is preferable. As alloy particles, the use of low-melting-point alloy particles having a melting point of 500° C. or below is preferable, and furthermore, the use of low-melting-point alloy particles having a melting point of 350° C. or below is more preferable because metallic bond can be formed between connecting terminals and from the viewpoint of connecting reliability. When low-melting-point alloy particles are used, it is preferable to previously coat the particle surfaces with flux or the like. Coating with so-called flux is preferable because oxides or the like on the surface can be removed. As the flux, a fatty acid or the like, such as abietic acid, can be used.

The ratio of the average particle size to the maximum particle diameter of the conductive particles is preferably 2 or less and more preferably 1.5 or less. It is preferable that the particle size distribution of the conductive particles is narrower, and the geometric standard deviation of the particle size distribution of the conductive particles is preferably 1.2 to 2.5 and more preferably 1.2 to 1.4. If the geometric standard deviation is within the above-described values, the variation of the particle diameters is reduced. Normally, when a constant gap is present between two terminals to be connected, it is considered that the more even the particle diameters, the more effectively conductive particles function.

The geometric standard deviation of particle size distribution means the value obtained by dividing the a value of the particle size distribution (the particle diameter value at 84.13% accumulation) by the particle diameter value at 50% accumulation. When particle diameters (logarithm) are set on the abscissa of the particle size distribution graph and the cumulative values (percent, cumulative number ratio, logarithm) are set on the ordinate, the particle size distribution becomes substantially straight line, and the particle size distribution follows logarithmic normal distribution. The cumulative value means the ratio of the number of particles having a certain particle diameter and smaller to the total number of particles expressed in percentage. The sharpness of particle size distribution is expressed by the ratio of σ (the particle diameter value at 84.13% accumulation) to the average particle size (the particle diameter value at 50% accumulation). The σ value is a reading value from an actual measured value or a plotted value in the above graph. The average particle size and particle size distribution can be measured using heretofore known methods and instruments, and for the measurements, a wet particle size distribution meter, laser particle size distribution meter, or the like can be used. Alternatively, the particles can be observed using an electron microscope or the like and the average particle size and particle size distribution can be calculated. The average particle size and particle size distribution in the present invention can be obtained using a laser particle size distribution meter.

The average particle size of the conductive particles is 1 to 8 μm, preferably 2 to 6 μm. In view of insulation properties, 8 μm or less is preferable, and the effect of variation in the height of connecting terminals or the like is insignificant; and in view of electrical connecting, 1 μm of more is preferable.

The average particle distance to adjacent conductive particles is not greater than 20 μm and at least once to five times, preferably at least 1.5 to 3 times the average particle size. In view of preventing particle coagulation due to particle flow in connecting and securing insulation properties, not less than once the average particle size is preferable; and in view of fine connecting, not greater than five times is preferable.

In the present invention, adjacent conductive particles mean 6 particles closest to an optionally selected conductive particle. The method for measuring the average particle distance to the adjacent conductive particles is as follows.

A photo enlarged by an optical microscope is taken, optional 20 particles are selected, distances to 6 particles closest to each particle are measured, and the average value of the total is obtained to make it the average particle distance.

The thickness of the anisotropic conductive adhesive sheet is at least 1.5 times the average particle distance but not greater than 40 μm and preferably at least twice the average particle distance but not greater than 40 μm. In view of mechanical connecting strength, not less than 1.5 times is preferable; and in view of preventing decrease in the number of coupled particles due to particle flow in connecting, not greater than 40 μm is preferable. The compounding quantity of conductive particles is preferably 0.5 parts by mass to 20 parts by mass relative to 100 parts by mass, more preferably 1 part by mass to 10 parts by mass of the components containing a curing agent and a curable insulating resin. In view of insulating properties, not greater than 20 parts by mass is preferable; and in view of electrical connecting properties, not less than 0.5 parts by mass is preferable.

Next, the anisotropic conductive adhesive sheet of the present invention will be described. In the anisotropic conductive adhesive sheet of the present invention, 90% or more of the conductive particles are present in a region of a thickness of not greater than 2.0 times the average particle size of the conductive particles extending from one surface of the anisotropic conductive adhesive sheet in the thickness direction; however, it is preferable that 90% or more of them are present in a region of 1.5 times, it is more preferable that 95% or more of them are present in a region of 2.0 times, and it is further preferable that 95% or more of them are present in a region of 1.5 times. Specifically, when the average particle size is 3.0 μm, "in a region of 2.0 times" means in a region of a thickness of 6.0 μm in the anisotropic conductive composition, and "90% or more of them are present in the region" means that 90% or more of the conductive particles are present in the layer of the thickness of 6.0 μm. In the anisotropic conductive adhesive sheet of the present invention, as the position where the conductive particles are present to the thickness direction of the anisotropic conductive adhesive sheet, the values of the positions of randomly selected 100 conductive particles measured using a laser microscope or the like that can measure the displacement of the focal direction are used. At the same time, the number of conductive particles present without contact with other conductive particles can also be measured. When the displacement of the focal direction is measured using the laser microscope, the resolution of displacement measurement is preferably 0.1 μm or less, and more preferably 0.01 μm or less. As the average particle size of the conductive particles, the value previously measured separately using a laser particle size distribution meter or the like is used. The thickness of the anisotropic conductive adhesive sheet of the present invention is preferably 3 to 20 times, more preferably 5 to 10 times the average particle size of the conductive particles. From the aspect of adhesion strength of the connecting structure, not less than 3 times is preferable; and from the aspect of connecting properties, less than 20 times is preferable. From the aspect of connecting properties, the region of not more than 2.0 times the average particle size of the conductive particles where 90% or more conductive particles are present is preferably outside the center portion in the thickness direction of the conductive adhesive sheet, and more preferably, a part of the conductive particles are exposed on the surface of the anisotropic conductive adhesive sheet. The region of not greater than 2.0 times the average particle size of the conductive particles is preferably within ½, more preferably ⅓ the thickness of the sheet in the thickness direction form the surface of the conductive sheet. It is also preferable that a part of the conductive particles are exposed on the surface of the anisotropic conductive adhesive sheet.

Next, a method for manufacturing an anisotropic conductive adhesive sheet characterized in that conductive particles in the present invention are present without contact with other conductive particles will be described. In the present invention, "conductive particles are present without contact with other conductive particles" means that each of the conductive particles is present alone without coagulation. Hereafter, the expression "present alone" or "single particle" may be used for this meaning. Although known methods can be used as the method for manufacturing the anisotropic conductive adhesive sheet of the present invention, a method is preferable wherein a single layer of conductive particles are arranged on a stretchable film or sheet, the conductive particles are dispersed and arrayed by stretching it, and they are transferred onto an adhesive sheet composed of at least a curing agent and a curable insulating resin while maintaining the stretched state. As the stretchable film, although a known resin film or the like can be used, the use of a homopolymer or copolymer of polyethylene resin, polypropylene resin, polyester resin, polyvinyl alcohol resin, polyvinylbutyral resin, polyvinylidene chloride resin or the like, or a flexible and stretchable film of a resin such as nitryl rubber, butadiene rubber, silicone rubber is preferable. Polypropylene resin and polyester resin are particularly preferable. The shrinking percentage after stretching is preferably 10% or less, and more preferably 5% or less.

As a method for dispersing, arranging and fixing conductive particles on a stretchable film, a known method can be used. For example, a method wherein an adhesive layer containing at least a thermoplastic resin is formed on the stretchable film, conductive particles are contacted and deposited thereon, and they are arranged in a single layer by applying load using a rubber roll can be adopted. In this case, to pack the conductive particles without gaps, repetition of deposition and rolling steps for several times is preferable. Since closest packing is the most stable structure in the case of spherical conductive particles, the conductive particles can be relatively easily packed. Alternatively, a method wherein an adhesive is applied onto the stretchable film to form an adhesive layer, conductive particles are adhered thereon, and adhesion is repeated several times, if required, to disperse and arrange the conductive particles in a singly layer: a method wherein a stretchable film is charged, the conductive particles are dispersed and adhered in a single layer and the like can be used.

Although a known methods can be used as a method for stretching a stretchable film on which a single layer of conductive particles is arranged, from the aspect of even diffusing and arranging, the use of biaxial stretching equipment is preferable. From the aspect of distance between particles, the percentage of stretching is preferably 80% or more and 400% or less, more preferably 100% or more and 300% or less. Stretching by 100% means that the length of the portion stretched along the stretching direction is 100% the length of the film before stretching. Although the stretching direction is optional, biaxial stretching of a stretching angle of 90° is preferable, and simultaneous stretching is preferable. Although the stretching direction is optional, biaxial stretching of a stretching angle of 90° is preferable, and simultaneous stretching is preferable. In the case of biaxial stretching, the percentage of stretching in each direction can be either same or different. As the biaxial stretching equipment, simultaneous biaxial continuous stretching equipment is preferable.

Although a known equipment can be used as the simultaneous biaxial continuous stretching equipment, a tenter-type stretching machine wherein long sides are fixed by chuck fittings, and the distances between them are simultaneously stretched in length and width directions to conduct continuous stretching is preferable. As the system to adjust stretching percentage, although a screw system or a pantograph system can be used, in view of the adjustment accuracy, the pantograph system is more preferable. In the case of stretching while heating, it is preferable to install a preheating zone before the stretching portion, and to install a heat fixing zone after the stretching portion.

As the method for manufacturing an anisotropic conductive adhesive sheet from the state wherein the conductive particles are dispersed and arranged by arranging a single layer of conductive particles on a stretchable film and stretching them, the use of a method wherein a previously fabricated adhesive sheet composed of at least a curable insulating resin is stacked, and conductive particles or an adhesive film containing conductive particles is transferred, is preferable. A method wherein a solution containing at least an insulating resin is applied in the dispersed and arranged state, and dried, then the anisotropic conductive adhesive sheet is peeled off the stretchable sheet or the like, can be used.

The anisotropic conductive adhesive sheet of the present invention can be a single-layer sheet or a laminate sheet wherein an adhesive sheet not containing conductive particles but containing at least an insulating resin is stacked. The film thickness of the adhesive sheet to be stacked is preferably thinner than the film thickness of the adhesive sheet containing conductive particles.

As the curable insulating resin used in the present invention, a thermosetting resin, a photo-curable resin, a thermosetting and photocurable resin, and an electron beam-curable resin can be used. For the ease of handling, the use of a thermosetting insulating resin is preferable. Although epoxy resin, acrylic resin and the like can be used as the thermosetting resin, epoxy resin is particularly preferable. The epoxy resin is a compound having 2 or more epoxy groups in the molecule, and a compound having a glycidylether group, a glycidylester group, or an alicyclic epoxy group, and a compound wherein a double bond in the molecule is epoxidized are preferable. Specifically, bisphenol-A-type epoxy resin, bisphenol-F-type epoxy resin, naphthalene-type epoxy resin, novolak-phenol-type epoxy resin, or modified epoxy resin thereof can be used.

The curing agent used in the present invention can by any curing agent that can cure the above-described thermosetting insulating resins. When a thermosetting resin is used as the curable insulating resin, the agent that reacts with the thermosetting resin at 100° C. or above to cure it is preferable. In the case of epoxy resin, from the aspect of storage properties, a latent curing agent is preferable, and for example, an imidazole curing agent, a capsule-type imidazole curing agent, a cationic curing agent, a radical curing agent, a Lewis acid curing agent, an amine imide curing agent, a polyamine salt curing agent, a hydrazide curing agent, or the like can be used. From the aspects of storage properties and low-temperature reactivity, the capsule-type imidazole curing agent is preferable.

To the anisotropic conductive adhesive sheet of the present invention, besides the curing agent and curable insulating resin, a thermoplastic resin or the like can be compounded. By compounding a thermoplastic resin, a sheet can be easily formed. The compounding quantity in this time is preferably 200% by mass, more preferably 100% by mass of the combined components of the curing agent and curable insulating resin. The thermoplastic resin that can be compounded in the present invention is phenoxy resin, polyvinyl acetal resin, polyvinyl butyral resin, alkylated cellulose resin, polyester resin, acrylic resin, styrene resin, urethane resin, polyethylene terephthalate resin, and the like. Such resins can be selectively used alone or in a combination of two or more. Among these resins, a resin having a polar group, such as hydroxyl and carboxyl groups, is preferable from the aspect of adhesive strength. Furthermore, it is preferable that the thermoplastic resin contains one or more thermoplastic resin having a glass transition temperature of 80° C. or above.

In the anisotropic conductive adhesive sheet of the present invention, additives can be compounded to the above-described components. In order to improve the adhesion between the anisotropic conductive adhesive sheet and the deposited material, a connecting agent can be compounded as an additive. As the connecting agent, although a silane connecting agent, titanium connecting agent, or aluminum connecting agent can be used, the silane connecting agent is preferable. As the silane connecting agent, γ-glycidoxypropyltrimethoxysilane, γ-glycidoxypropyltriethoxysilane, γ-mercaptotrimethoxysilane, γ-aminopropyltrimethoxysilane, β-aminoethyl-γ-aminopropyltrimethoxysilane, γ-ureidopropyltrimethoxysilane, or the like can be used. The compounding quantity of the connecting agent is preferably 0.01 part by mass to 1 part by mass based on 100 parts by mass of the combination of the curing agent and curable insulating resin. In view of improving adhesion, 0.01 part by mass or more is preferable and in view of reliability, 1 part by mass or less is preferable.

Furthermore, in order to prevent the lowering of insulating properties due to ionic components in the anisotropic conductive adhesive sheet when absorbing moisture, an ion scavenger can be compounded as an additive. As the ion scavenger, although an organic ion exchanger, an inorganic ion exchanger, an inorganic ion adsorbing agent, or the like can be used, an inorganic ion exchanger, which has excellent heat resistance, is preferable. As the inorganic ion exchanger, a zirconium compound, a zirconium-bismuth compound, an antimony-bismuth compound, a magnesium-aluminum compound, or the like can be used. Although the types of ions to be exchanged include a cation type, an anion type, and an amphoteric ion type, the amphoteric ion type is preferable because it can exchange both metal ions (cations), which directly cause ion migration, and anions, which cause the elevation of electrical conductivity and the formation of metal ions. The average particle size of the ion scavenger to be compounded is preferably 0.01 μm or more and 5 μm or less, more preferably 0.01 μm or more and 1 μm or less.

Next, a method for manufacturing the anisotropic conductive adhesive sheet of the present invention will be described.

First, an adhesive layer is provided on a biaxially stretchable film to form a laminate, conductive particles having an average particle size of 1 to 8 μm are closely packed on the laminate to fabricate a conductive-particle adhered film, the conductive-particle adhered film is biaxially stretched and held so that the average particle distance between the conductive particles and adjacent particles is at least once but five times or less the average particle size of the conductive particles and 20 μm or less, and the conductive particles are transferred on an adhesive sheet containing at least a curing agent and a curable insulating resin and having a thickness of 1.5 times or more the average particle distance of the conductive particles and 40 μm or less, to manufacture the anisotropic conductive adhesive sheet of the present invention. Preferably, the biaxially stretchable film is a long film, and the adhesive sheet is also a long adhesive sheet.

Although known adhesives can be used in the adhesive layer, when biaxial stretching is performed while heating, the use of a non-thermal cross-linking adhesive is preferable. Specifically, a natural rubber latex adhesive, a synthetic rubber latex adhesive, a synthetic resin emulsion adhesive, silicone adhesive, ethylene-vinyl acetate copolymer adhesive, and the like can be used alone or in combination. As the adhesion of the adhesive, the peeling strength of the surface of the surface metal of the conductive particles to be used is preferably within a range between 0.5 gf/cm and 40 gf/cm, more preferably within a range between 1 gf/cm and 20 gf/cm. As the measuring method, a method wherein a glass plate coated with a metal having the same composition as the surface metal of the conductive particles is prepared, a film having a width of 2 cm coated with the adhesive is adhered, and 90° peeling strength is measured, can be used. In view of holding the conductive particles when the conductive particles are adhered and when the film is stretched, the peeling strength is preferably 0.5 gf/cm or more; and in view of transferring particles to the adhesive sheet after stretching, the peeling strength is preferably 40 gf/cm or less. The thickness of the adhesive layer is preferably within a range between 1/50 and twice, more preferably 1/10 and once the average particle size of the conductive particles to be used. In view of holding the conductive particles when the conductive particles are adhered and when the film is stretched, the thickness is preferably 1/50 or more the average particle size of the conductive particles; and in view of transferring particles to the adhesive sheet after stretching, the thickness is preferably twice or less. As the method for forming the adhesive layer, a method wherein the adhesive dispersed or dissolved in a solvent or water is applied using a heretofore known method, such as a gravure coater, die coater, knife coater, bar coater, or the like, and dried, can be used. When a hot-melt-type adhesive is applied, roll coating without solvent can be performed.

As the method for closely packing the conductive particles, the above-described method wherein conductive particles are dispersed and arranged on a stretchable film and fixed can be used.

The film thickness of the film after stretching is preferably 1/10 to once, more preferably 1/5 to 1/2 of the sum of the film thickness of the adhesive sheet to be transferred and the support film of the adhesive sheet. In view of handling the film after stretching, the film thickness is preferably 1/10 or more of the sum of the film thickness; and in view of transferring particles to the adhesive sheet after stretching, the film thickness is preferably once or less of the sum of the film thickness.

The present invention also relates to a method for electrically connecting an electronic circuit component having fine connecting terminals to a circuit board having a circuit corresponding to the electronic circuit component using an anisotropic conductive adhesive sheet. In the fine connecting method, the height of the fine connecting terminal of the electronic circuit component is 3 to 15 times the average particle distance of the conductive particles but not greater than 40 μm, the distance between the fine connecting terminals is 1 to 10 times the average particle distance but not greater than 40 μm, and the pitch of the fine connecting terminals is 3 to 30 times the average particle distance of the conductive particles but not greater than 80 μm. The electronic circuit component is electrically coupled to the circuit board having a circuit corresponding to the electronic circuit component using the anisotropic conductive adhesive sheet of the present invention.

The height of the connecting terminal is 3 to 15 times the average particle distance of the conductive particles but not greater than 40 μm, and 4 to 10 times are preferable. In view of the mechanical strength of the connecting structure, not less than 3 times are preferable; and in view of the movement of conductive particles due to the resin flow of the adhesive sheet occurring in connecting, the lowering of connecting properties due to lowered number of conductive particles in the lower portion of the connecting terminal, the movement of conductive particles present in the area other than the connecting portion, and the lowering of insulating properties due to coagulation, not more than 15 times and not more than 40 μm are preferable. The distance between connecting terminals is once to 10 times the average particle distance but not greater than 40 μm, preferably once to 10 times but not greater than 20 μm, and more preferably 2 to 5 times but not greater than 15 μm. In view of insulating properties, once or more is preferable and in view of fine connecting, not more than 10 times and not greater than 40 μm is preferable. The pitch is 3 to 30 times the average particle distance but not greater than 80 μm, and preferably 5 to 20 times but not greater than 40 μm. In view of connecting properties, 3 times or more is preferable; and in view of fine connecting, not more than 30 times but not greater than 80 μm is preferable.

The present invention also relates to a fine connecting structure connected by the above-described fine connecting method.

The material of the circuit bard coupled using an anisotropic conductive adhesive sheet of the present invention can be either an organic board or an inorganic board. As the organic board, a polyimide film board, a polyamide film board, a polyethersulfone film board, a rigid board produced by impregnating epoxy resin into glass cloth, a rigid board produced by impregnating bismaleimide-triazine resin into glass cloth, or the like can be used. As the inorganic board, a silicon board, a glass board, an alumina board, an aluminum nitride board, or the like can be used. As the wiring material for a wiring board, an inorganic wiring material, such as indium tin oxide, indium zinc oxide or the like; a metal wiring material, such as gold-plated copper, chromium-copper, aluminum and gold bumps; a composite wiring material wherein an inorganic wiring material such as indium tin oxide is covered with a metallic material, such as aluminum and chromium, or the like can be used.

The distance between connecting circuits used in the present invention is preferably 3 to 500 times the average particle size of conductive particles in view of electrical insulating properties. In the connecting circuit used in the present invention, the connecting area of the circuit portion to be connected is preferably 1 to 10000 times the square of the value of the above-described average particle size. From the aspect of connecting properties, 2 to 100 times are particularly preferable.

The anisotropic conductive adhesive sheet of the present invention or the connecting structure of the present invention can be used for connecting the display device, such as a liquid crystal display device, a plasma display device, and an electroluminescence display device to a wiring board; mounting electronic parts, such as an LSI, of these devices; connecting other devices to a wiring board; and mounting electronic parts, such as an LSI. Among the above-described display devices, the anisotropic conductive adhesive sheet or the connecting structure can be suitably used in the plasma display device, and the electroluminescence display device, which require reliability.

Next, the present invention will be described in further detail referring to examples and comparative examples.

EXAMPLE 1

In an ethyl acetate-toluene mixed solvent (mixing ratio of 1:1), 37 g of a phenoxy resin (glass transition temperature: 98° C., number average molecular weight: 14000), 26 g of a bisphenol-A-type epoxy resin (epoxy equivalent: 190, viscosity at 25° C.: 14000 mPa·S), and 0.3 g of γ-glycidoxypropyltrimethoxysilane were dissolved to produce a solution having a solid content of 50%.

In the solution having a solid content of 50%, 37 g of a liquid epoxy resin containing a microcapsule-type latent imidazole curing agent (average particle size of the microcapsules: 5 μm, activating temperature: 125° C.) was compounded and dispersed. Thereafter, the dispersion was applied onto a polyethylene terephthalate film having a thickness of 50 μm, wind-dried at 60° C. for 15 minutes to obtain a film-like adhesive sheet having a film thickness of 20 μm.

Onto a non-stretched polypropylene film having a thickness of 45 μm coated with a nitrile rubber latex-methyl methacrylate graft copolymer adhesive having a thickness of 5 μm, a single layer of gold-plated plastic particles of an average particle size of 3.0 μm were applied so as to be substantially free of gaps. Specifically, a container having a width larger than the width of the film packed with the gold-plated plastic particles so as to have a thickness of several layers was prepared, the film with the adhesive applied surface facing downward was pressed against the gold-plated particles to adhere, and thereafter, excessive particles were scraped down with a scraper made of a non-woven fabric. By repeating this procedure twice, a single-layer coated film without gaps was obtained. The particle size distribution of the gold-plated plastic particles was previously measured using a laser particle size distribution meter (HELOS SYSTEM, manufactured by JEOL), and the value at 50% cumulative value was made to be the average particle size. The film was fixed using a biaxial stretching equipment (corner stretching type biaxial stretching equipment of pantograph system, X6H-S manufactured by Toyo Seiki Seisaku-sho, Ltd.) using 10 chucks in each of lengthwise and crosswise directions, preheated at 150° C. for 120 seconds, then, stretched by 100% in each of lengthwise and crosswise directions at a rate of 20%/sec and fixed. After stacking the adhesive sheet on the stretched film, the adhesive sheet was peeled off to obtain an anisotropic conductive adhesive sheet. From the conductive particles on the obtained anisotropic conductive adhesive sheet, 100 particles were randomly selected, and the distance from the surface of the anisotropic conductive adhesive sheet was measured using a laser microscope that can measure the displacement in the focal point direction (VK9500, manufactured by Keyence Corporation, shape measurement resolution: 0.01 μm). As a result, it was known that 95% of the conductive particles were present within the layer shown in a range of 5.5 μm in the film thickness direction of the anisotropic conductive adhesive sheet. Of the 100 measured conductive particles, 92% were single particles. The average distance between particles was 4.17 μm, which was 1.39 times the average particle size.

EXAMPLE 2

In an ethyl acetate-toluene mixed solvent (mixing ratio: 1:1), 42 g of a phenoxy resin (glass transition temperature: 45° C., number average molecular weight: 12000), 32 g of a naphthalene-type epoxy resin (epoxy equivalent: 136, semisolid), and 0.06 g of γ-ureidopropyltrimethoxysilane were dissolved to produce a solution having a solid content of 50%. In the solution having a solid content of 50%, 26 g of a liquid epoxy resin containing a microcapsule-type latent imidazole curing agent (average particle size of the microcapsules: 5 μm, activating temperature: 125° C.) was compounded and dispersed. Thereafter, the dispersion was applied onto a polyethylene terephthalate film having a thickness of 50 μm, wind-dried at 60° C. for 15 minutes to obtain a film-like adhesive sheet having a film thickness of 15 μm.

Onto a non-stretched polypropylene film having a thickness of 45 μm coated with a nitrile rubber latex-methyl methacrylate graft copolymer adhesive having a thickness of 5 μm, a single layer of gold-plated plastic particles of an average particle size of 2.5 μm were applied in the same manner as in Example 1 so as to be substantially free of gaps. The film was stretched using biaxial stretching equipment by 120% in each of lengthwise and crosswise directions in the same manner as in Example 1, and fixed. After stacking the adhesive sheet on the stretched film, the adhesive sheet was peeled off to obtain an anisotropic conductive adhesive sheet. From the conductive particles on the obtained anisotropic conductive adhesive sheet, 100 particles were randomly selected, and the distance from the surface of the anisotropic conductive adhesive sheet was measured using a laser displacement gage. As a result, it was known that 95% of the conductive particles were present within the layer shown in a range of 4.8 μm in the film thickness direction of the anisotropic conductive adhesive sheet. Of the 100 measured conductive particles, 91% were single particles. The average distance between particles was 4.24 μm, which was 1.70 times the average particle size.

EXAMPLE 3

In an ethyl acetate-toluene mixed solvent (mixing ratio: 1:1), 15 g of a phenoxy resin (glass transition temperature: 45° C., number average molecular weight: 12000), 24 g of a phenoxy resin (glass transition temperature: 98° C., number average molecular weight: 14000), 26 g of a naphthalene-type epoxy resin (epoxy equivalent of 136, semisolid), and 0.1 g of γ-glycidoxypropyltrimethoxysilane were dissolved to produce a solution having a solid content of 50%. In the solution having a solid content of 50%, 35 g of a liquid epoxy resin containing a microcapsule-type latent imidazole curing agent (average particle size of the microcapsules: 5 μm, activating temperature: 125° C.) was compounded and dispersed.

Thereafter, the dispersion was applied onto a polyethylene terephthalate film having a thickness of 50 μm, wind-dried at 60° C. for 15 minutes to obtain a film-like adhesive sheet A having a film thickness of 15 μm.

Furthermore, a film-like adhesive sheet B having a film thickness of 5 μm was obtained in the same manner as described except that a polyethylene terephthalate film undergone easy-peeling treatment was used.

Onto a non-stretched polypropylene film having a thickness of 45 μm coated with a nitrile rubber latex-methyl methacrylate graft copolymer adhesive having a thickness of 5 μm, a single layer of gold-plated nickel particles of an average particle size of 2.6 μm were applied in the same manner as in Example 1 so as to be substantially free of gaps. The film was stretched using biaxial stretching equipment by 200% in each of lengthwise and crosswise directions in the same manner as in Example 1, and fixed. After stacking the adhesive sheet A on the stretched film, the adhesive sheet was peeled off, and the adhesive sheet B was stacked on the peeled surface to obtain an anisotropic conductive adhesive sheet. From the conductive particles on the obtained anisotropic conductive adhesive sheet, 100 particles were randomly selected, and the distance from the surface of the anisotropic conductive adhesive sheet was measured using a laser displacement gage. As a result, it was known that 95% of the conductive particles were present within the layer shown in a range of 4.9 μm in the film thickness direction of the anisotropic conductive adhesive sheet. Of the 100 measured conductive particles, 91% were single particles. The average distance between particles was 7.22 μm, which was 2.77 times the average particle size.

COMPARATIVE EXAMPLE 1

In an ethyl acetate-toluene mixed solvent (mixing ratio of 1:1), 37 g of a phenoxy resin (glass transition temperature: 98° C., number average molecular weight: 14000), 26 g of a bisphenol-A-type epoxy resin (epoxy equivalent: 190, viscosity at 25° C.: 14000 mPa·S), and 0.3 g of γ-glycidoxypropyltrimethoxysilane were dissolved to produce a solution having a solid content of 50%.

In the solution having a solid content of 50%, 37 g of a liquid epoxy resin containing a microcapsule-type latent imidazole curing agent (average particle size of the microcapsules: 5 μm, activating temperature: 125° C.), and 2.0 g of gold-plated plastic particles having an average particle size of 3.0 μm was compounded and dispersed. Thereafter, the dispersion was applied onto a polyethylene terephthalate film having a thickness of 50 μm, wind-dried at 60° C. for 15 minutes to obtain a film-like anisotropic conductive adhesive sheet having a film thickness of 20 μm.

From the conductive particles on the obtained anisotropic conductive adhesive sheet, 100 particles were randomly selected, and the distance from the surface of the anisotropic conductive adhesive sheet was measured using a laser displacement gage. As a result, it was known that conductive particles were randomly present in the film thickness direction of the anisotropic conductive adhesive sheet. Of the 100 measured conductive particles, 75% were single particles.

COMPARATIVE EXAMPLE 2

In an ethyl acetate-toluene mixed solvent (mixing ratio of 1:1), 42 g of a phenoxy resin (glass transition temperature: 45° C., number average molecular weight: 12000), 32 g of a naphthalene-type epoxy resin (epoxy equivalent of 136, semi-solid), and 0.06 g of γ-ureidopropyltrimethoxysilane were dissolved to produce a solution having a solid content of 50%. In the solution having a solid content of 50%, 26 g of a liquid epoxy resin containing a microcapsule-type latent imidazole curing agent (average particle size of the microcapsules: 5 μm, activating temperature: 125° C.), and 6.0 g of gold-plated nickel particles having an average particle size of 2.6 μm was compounded and dispersed. Thereafter, the dispersion was applied onto a polyethylene terephthalate film having a thickness of 50 μm, wind-dried at 60° C. for 15 minutes to obtain a film-like anisotropic adhesive sheet having a film thickness of 20 μm.

From the conductive particles on the obtained anisotropic conductive adhesive sheet, 100 particles were randomly selected, and the distance from the surface of the anisotropic conductive adhesive sheet was measured using a laser displacement gage. As a result, it was known that conductive particles were randomly present in the film thickness direction of the anisotropic conductive adhesive sheet. Of the 100 measured conductive particles, 70% were single particles.

COMPARATIVE EXAMPLE 3

As anisotropic conductive adhesive sheet was obtained in the same manner as in Example 1 except that gold-plated plastic particles of an average particle size of 10 μm were used, and the sheet was stretched by 60%. From the conductive particles on the obtained anisotropic conductive adhesive sheet, 100 particles were randomly selected, and the distance from the surface of the anisotropic conductive adhesive sheet was measured using a laser displacement gage. As a result, it was known that 96% of the conductive particles were present within the layer shown in a range of 19.2 μm in the film thickness direction of the anisotropic conductive adhesive sheet.

Of the 100 measured conductive particles, 93% were single particles. The average distance between particles was 8.52 μm, which was 0.85 times the average particle size.

(Method for Measuring Connecting Resistance Value)

After forming an oxide film on the entire surface of a silicon piece (thickness: 0.5 mm) having a width of 1.6 mm and a length of 15.1 mm, 175 and 16 thin aluminum films (1000 angstroms) each having a width of 74.5 μm and a length of 120 μm were formed on the long side and the short side, respectively, 40 μm inside of the peripheral portions, so that the each distance between films becomes 0.1 μm. In order to form two gold bumps (thickness: 15 μm) each having a width of 25 μm and a length of 100 μm on each of these thin aluminum films so as to have a distance of 15 μm, on the portion other than an opening having a width of 10 μm and a length of 85 μm on 7.5 μm inside of the peripheral portion of the gold-bump disposing position, a polyimide protective film was formed on the entire surface other than the above-described opening using a normal method. Thereafter, the above-described gold bumps were formed to be test chips.

On alkali-free glass of a thickness of 0.7 mm, a connecting pad (width: 66 μm, length: 120 μm) of indium-tin oxide (thickness: 1400 angstrom) was formed so as to be connected in the position relationship to be a pair with a gold bump on the thin aluminum film adjacent to a gold bump on the above-described thin aluminum film. Each time 20 gold bumps were connected, an outgoing wiring of a thin indium-tin oxide was formed on the above-described connecting pad, and a thin aluminum-titanium film (titanium: 1%, 3000 angstroms) was formed on the outgoing wiring to be a connecting evaluating board. On the above-described connecting evaluating board, an anisotropic conductive adhesive sheet having a width of 2 mm and a length of 17 mm was temporarily bonded so that the entire connecting pad was covered, and after pressing at 80°

C. under 0.3 MPa for 3 seconds using a pressure bonding head of a width of 2.5 mm, the base film of polyethylene terephthalate was peeled off. A test chip was placed thereon so that the locations of the above-described connecting pad and gold bump are aligned and pressure-bonded at 220° C. for 5 seconds under 5.2 MPa. After pressure bonding, the resistance value between the above-described outgoing wirings (daisy chain of 20 gold bumps) was measured using a resistance meter of a 4-terminal method to be a connecting resistance value.

(Method for Testing Insulation Resistance)

On alkali-free glass of a thickness of 0.7 mm, a connecting pad (width: 65 μm, length: 120 μm) of indium-tin oxide (1400 angstrom) was formed in the position relationship so that 2 gold bumps on the above-described thin aluminum film could be coupled to each other. A connecting wiring of a thin indium-tin oxide was formed so that 5 connecting pads could be alternately coupled, and another connecting wiring of a thin indium-tin oxide was formed so that 5 connecting pads could be alternately coupled so as to be pair with them and form a comb-shaped pattern. On each connecting wiring, an outgoing wiring of a thin indium-tin oxide film was formed, and a thin aluminum-titanium film (titanium: 1%, 3000 angstroms) was formed on the outgoing wiring to be an insulating property evaluating board. On the above-described insulating property evaluating board, an anisotropic conductive adhesive sheet having a width of 2 mm and a length of 17 mm was temporarily bonded so that the entire connecting pad was covered, and after pressing at 80° C. under 0.3 MPa for 3 seconds using a pressure bonding head of a width of 2.5 mm, the base film of polyethylene terephthalate was peeled off. A test chip was placed thereon so that the locations of the above-described connecting pad and gold bump are aligned and pressure-bonded at 220° C. for 5 seconds under 2.6 MPa to be an insulating resistance testing board.

While holding the insulating resistance testing board at 60° C. and a relative humidity of 90%, a DC voltage of 100 V was impressed between paired outgoing wirings using a constant-voltage constant-current power source. The insulation resistance between these wirings was measured once every 5 minutes, and time until the insulation resistance value becomes 10 MΩ or less was measured to be an insulation lowering time. The case when the insulation lowering time was less than 240 hours was evaluated as × (bad), and the case of 240 hours or more was evaluated as ○ (good);

The above results are shown in Table 1.

TABLE 1

|  | Connection resistance value (Ω) | Insulation resistance test |
|---|---|---|
| Example 1 | 12.4 | ○ (good) |
| Example 2 | 11.9 | ○ (good) |
| Example 3 | 13.5 | ○ (good) |
| Comparative Example 1 | 26.2 | X (bad) (short-circuiting) |
| Comparative Example 2 | 14.0 | X (bad) (short-circuiting, initial) |
| Comparative Example 3 | 13.1 | X (bad) (short-circuiting, initial) |

As is obvious from Table 1, the anisotropic conductive adhesive according to the present invention exerts very excellent insulation reliability.

INDUSTRIAL APPLICABILITY

The anisotropic conductive adhesive sheet according to the present invention exerts low connecting resistance and high insulation reliability, and is suitable as a bare chip connecting material wherein fine circuit connecting is required, and a connecting material for a high-definition display device and the like.

What is claimed is:

1. A method for manufacturing an anisotropic conductive adhesive sheet comprising at least a curing agent, a curable insulating resin, and conductive particles, said method comprising providing an adhesive layer on a biaxially stretchable film to form a laminate, densely packing conductive particles having an average particle size of 1 to 8 μm on the laminate to form a conductive particle-attached film, biaxially stretching and holding the conductive particle-attached film so that the average particle distance between adjacent conductive particles is one to five times the average particle size of the conductive particles and not greater than 20 μm, and transferring the conductive particles to an adhesive sheet containing at least a curing agent and a curable insulating resin and having a thickness of at least 1.5 times the average particle distance between the conductive particles but not greater than 40 μm.

* * * * *